US011682880B2

(12) United States Patent
Xu et al.

(10) Patent No.: US 11,682,880 B2
(45) Date of Patent: Jun. 20, 2023

(54) TECHNIQUES FOR DYNAMIC VOLTAGE CONTROL FOR LASER DIODES IN HEAD-WEARABLE DISPLAY DEVICES

(71) Applicant: GOOGLE LLC, Mountain View, CA (US)

(72) Inventors: Kai Xu, Mississauga (CA); Kevin Orr, Elmira (CA)

(73) Assignee: GOOGLE LLC, Mountain View, CA (US)

( * ) Notice: Subject to any disclaimer, the term of this patent is extended or adjusted under 35 U.S.C. 154(b) by 252 days.

(21) Appl. No.: 17/238,781

(22) Filed: Apr. 23, 2021

(65) Prior Publication Data

US 2022/0344898 A1    Oct. 27, 2022

(51) Int. Cl.
*H01S 5/042* (2006.01)
*G02B 27/01* (2006.01)

(52) U.S. Cl.
CPC .......... *H01S 5/042* (2013.01); *G02B 27/0172* (2013.01)

(58) Field of Classification Search
CPC ... H01S 5/0617; H01S 5/4093; H01S 5/06808
See application file for complete search history.

(56) References Cited

U.S. PATENT DOCUMENTS

| 2004/0202216 | A1 | 10/2004 | Fairgrieve | |
|---|---|---|---|---|
| 2019/0324288 | A1* | 10/2019 | Moore | G02C 5/20 |
| 2019/0369253 | A1* | 12/2019 | Aleem | G01S 17/66 |
| 2019/0384063 | A1* | 12/2019 | Oliver | G02B 27/0172 |
| 2020/0192130 | A1* | 6/2020 | Maimone | G02F 1/0128 |

FOREIGN PATENT DOCUMENTS

WO    2019070916 A1    4/2019

* cited by examiner

*Primary Examiner* — Paul C Lee (57) ABSTRACT

The present disclosure relates generally to a device, such as a wearable display device configured with a laser diode driver implementing dynamic voltage control for laser diodes. The laser diodes may include one or more of a red laser diode, a blue laser diode, and a green laser diode. The device may determine a load condition based on a frame to be displayed at the device, and determine a target voltage level for a laser diode operably coupled to the laser diode driver of the device based on the load condition (e.g., an image signal processor (ISP) frame buffer load). The device may generate the target voltage level for the laser diode based on a base voltage level. For example, the device may be configured with a voltage booster operably coupled to the laser diode driver to provide the target voltage level in addition to the base voltage level.

20 Claims, 7 Drawing Sheets

TECHNIQUES FOR DYNAMIC VOLTAGE CONTROL FOR LASER DIODES IN HEAD-WEARABLE DISPLAY DEVICES

BACKGROUND

Head-wearable display devices have increasingly become a useful way of supporting user interaction with various applications, such as virtual reality applications, augmented reality applications, and the like. For example, a head-wearable display device may display information, generated by one or more of the various applications, by projecting images onto a display surface or directly onto the retina of the user. In some cases, the images are projected via laser light generated by one or more laser diode drivers, which may function as a current source (also referred to as a current sink) that delivers a current to a respective laser diode.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Various aspects of the present disclosure relate to techniques for dynamic voltage control for laser diodes in a wearable display device (also referred to as a head wearable display device or a head mounted display device). The laser diodes of the wearable display device may be powered by a laser diode driver. The wearable display device may be configured to set a boost voltage to a preferred voltage level (also referred to as a base voltage level) to accommodate the laser diode driver. For example, the wearable display device may set the boost voltage to accommodate the laser diode forward voltage drop of a respective laser diode or a group of laser diodes and a power headroom of the laser diode driver for various load conditions (e.g., a number of particular pixels, such as blue pixels, red pixels, and/or green pixels in an image signal processor (ISP) frame buffer load). When a load condition is above a threshold, the wearable display device may be configured to generate extra voltage in addition to the base voltage level to meet a target voltage level in response to the load condition using one or more operations as described herein. By changing the voltage based on the load condition, the wearable display device may reduce a latency for dynamically adjusting a voltage level for varying load conditions. As a result, the wearable display device may experience faster responsiveness (e.g., 10 μs or less) for voltage control of a respective laser diode or a group of laser diodes, thereby improving the user experience.

Figure 1:
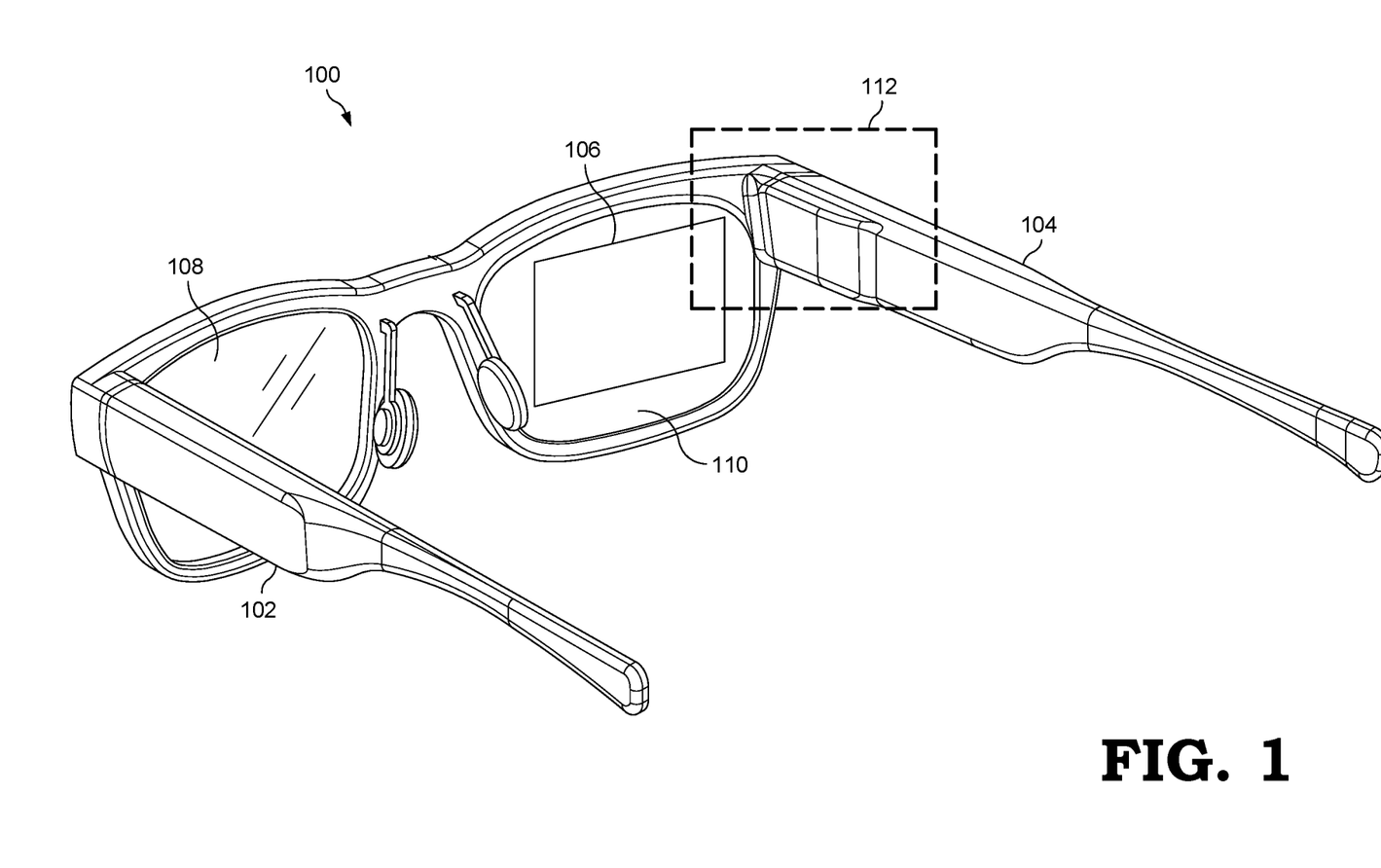
FIG. 1 illustrates a block diagram of a device that supports techniques for dynamic voltage control for laser diodes in accordance with embodiments of the present disclosure.

FIG. 1 illustrates a block diagram of a wearable display device 100 that supports techniques for dynamic voltage control for laser diodes in accordance with embodiments of the present disclosure. The wearable display device 100 may include an arm 104, which houses a laser projection system configured to project images toward the eye of a user, such that the user perceives the projected images as being displayed in a field-of-view area 106 of a display at one or both of lens elements 108, 110. The wearable display device 100 may be a near-eye display system in the form of a wearable display device, in which a support structure 102 is configured to be worn on the head of a user and has a general shape and appearance (that is, form factor) of an eyeglasses frame. The support structure 102 contains or otherwise includes various components to facilitate the projection of such images toward the eye of the user, such as a laser projector, an optical scanner, and a waveguide. In some embodiments, the support structure 102 further includes various sensors, such as one or more front-facing cameras, rear-facing cameras, other light sensors, motion sensors, accelerometers, and the like.

The support structure 102 may also include one or more radio frequency interfaces or other wireless interfaces, such as a Bluetooth interface, a Wi-Fi interface, and the like. In some embodiments, the support structure 102 further includes one or more batteries or other portable power sources for supplying power to the electrical components of the wearable display device 100. In some embodiments, some or all of these components of the wearable display device 100 are fully or partially contained within an inner volume of the support structure 102, such as within the arm 104 in region 112 of the support structure 102. It should be noted that while an example form factor is depicted, it will be appreciated that in other embodiments the display system 100 may have a different shape and appearance from the eyeglasses frame depicted in FIG. 1. It should be understood that instances of the term "or" herein refer to the non-exclusive definition of "or", unless noted otherwise. For example, herein the phrase "X or Y" means "either X, or Y, or both".

One or both of the lens elements 108, 110 are used by the wearable display device 100 to provide an augmented reality display in which rendered graphical content can be superimposed over or otherwise provided in conjunction with a real-world view as perceived by the user through the lens elements 108, 110. For example, laser light used to form a perceptible image or series of images may be projected by a laser projector of the wearable display device 100 onto the eye of the user via a series of optical elements, such as a waveguide formed at least partially in the corresponding lens element, one or more scan mirrors, and one or more optical relays. One or both of the lens elements 108, 110 thus include at least a portion of a waveguide that routes display light received by an incoupler of the waveguide to an outcoupler of the waveguide, which outputs the display light toward an eye of a user of the display system 100.

The display light is modulated and scanned onto the eye of the user such that the user perceives the display light as an image. In addition, each of the lens elements 108, 110 is sufficiently transparent to allow a user to see through the lens elements to provide a field of view of the user's real-world environment such that the image appears superimposed over at least a portion of the real-world environment. In some embodiments, the projector is a digital light processing-based projector, a scanning laser projector, or any combination of a modulative light source, such as a laser or one or more light-emitting diodes and a dynamic reflector mechanism such as one or more dynamic scanners or digital light processors. The projector includes multiple laser diodes (e.g., a red laser diode, a green laser diode, and a blue laser diode) and at least one scan mirror (e.g., two one-dimensional scan mirrors, which may be micro-electromechanical system (MEMS)-based or piezo-based).

The projector is communicatively coupled to the controller and a non-transitory processor-readable storage medium or memory storing processor-executable instructions and other data that, when executed by the controller, cause the controller to control the operation of the projector. In some embodiments, the controller controls a scan area size and scan area location for the projector and is communicatively coupled to a processor (not shown) that generates content to be displayed at the wearable display device 100. The projector scans light over a variable area designated as the field-of-view area 106 of the wearable display device 100. The scan area size corresponds to the size of the field-of-view area 106 and the scan area location corresponds to a region of one of the lens elements 108, 110 at which the field-of-view area 106 is visible to the user.

In some embodiments, the wearable display device 100 may be configured with a laser diode driver, such as within the arm 104 in region 112 of the support structure 102, which may function as a current source (e.g., a current sink) that delivers a current to a respective laser diode (e.g., a red laser diode, a green laser diode, and a blue laser diode). The laser diode driver may be configured to drive the current to the respective laser diode safely and at a minimum power level needed to drive the current to the respective laser diode. In some embodiments, a voltage may be applied to the respective laser diode to provide the minimum power level. An amplitude of the voltage may be dependent on various factors, for example, including a laser diode forward voltage drop. In some embodiments, the wearable display device 100 (e.g., a head-wearable display device) may improve resource usage (e.g., power consumption, higher battery life) due to laser diode drivers of the wearable display device 100 operating at an efficient laser diode forward voltage drop and power headroom. To implement the efficient resource usage (e.g., power consumption) the wearable display device 100 may implement dynamic voltage control for laser diodes as described in FIGS. 2 through 7.

Figure 2:
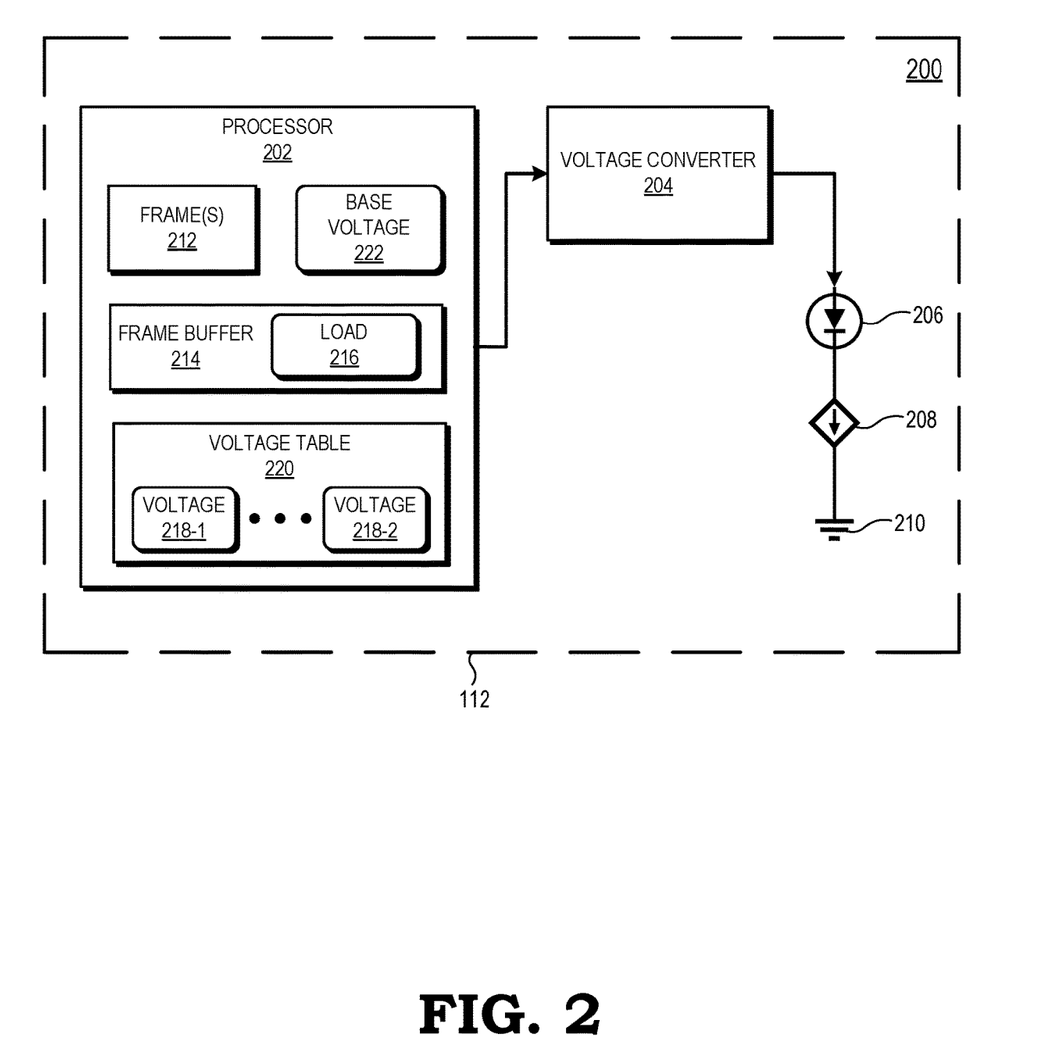
FIGS. 2 and 3 show block diagrams of laser channel configurations that support techniques for dynamic voltage control for laser diodes in accordance with embodiments of the present disclosure.

FIG. 2 shows a block diagram of a laser channel configuration 200 that supports techniques for dynamic voltage control for laser diodes in accordance with embodiments of the present disclosure. The laser channel configuration 200 or be implemented by aspects of the wearable display device 100 or the device 400 as described with reference to FIGS. 1 and 4, respectively. The laser channel configuration 200 may include a processor 202, a voltage converter 204, a laser diode 206, a current source 208, and a ground 210. Some or all of these components are fully or partially contained within an inner volume of the support structure 102, such as within the arm 104 in region 112 of the support structure 102 of the wearable display device 100 as described with reference to FIG. 1. One or more of these components may be coupled (e.g., operatively, communicatively, functionally, electronically) to each other. One or more of these components may include an input terminal and an output terminal.

The processor 202 may be an example of a processor as described herein. For example, the processor 202 may be a custom integrated circuit. In some embodiments, the processor 202 may be an image signal processor (ISP). The processor 202 may include an output terminal that is coupled to an input of the voltage converter 204. For example, the processor 202 and the voltage converter 204 may be in electronic communication via an interface, such as a data bus or a digital-to-analog converter (DAC) control. The processor 202 may determine a target voltage level for the laser diode 208 based at least in part on a load condition (e.g., a load of the laser diode 208). The laser diode 208 may be operably coupled to the current source 210 (e.g., a laser diode driver associated with a device, such as wearable display device for augmented reality applications). The laser diode 208 may be a red laser diode.

In some embodiments, the processor 202 may output a control signal to the voltage converter 204 to change a voltage level based on the load condition (e.g., a high load condition). In some other embodiments, the processor 202 may output a control signal to the voltage converter 204 to modify a voltage level to the target voltage level based on a change in the load condition. For example, the processor 202 may determine that the load condition changed from a first load condition (e.g., a low load condition below a threshold) to a second load condition (e.g., a high load condition above a threshold). Based on this determination, the processor 202 may signal to the voltage converter 204 to generate (or provide) the target voltage level for the laser diode 208 in addition to a base voltage level. An output terminal of the voltage converter 204 may be coupled to an input terminal of the laser diode 208. The processor 202 may be configured to set the base voltage level based on a load condition (e.g., a low load condition or a high load condition).

The voltage converter 204 may be a buck converter, which may be a step-down converter such as a direct current-to-direct current (DC-to-DC) power converter. The voltage converter 204 may thereby step-down voltage while stepping up current from its input supply to its output load, for example, the laser diode 208. The voltage converter 204 may provide the target voltage level to the laser diode 208 for high load conditions. For example, the voltage converter 204 may provide a voltage swing above the base voltage level to meet the target voltage level. Thus, the laser channel configuration 200 may provide improvements to operations of devices, such as wearable display devices by reducing a latency for dynamically adjusting a voltage level for varying load conditions. As a result, the laser channel configuration 200 may provide faster timing control (e.g., 10 µs) for voltage control of the laser diode 208.

By way of example, the processor 202 may receive one or more frames 212 from an application (e.g., an augmented reality application) to be displayed, such as at the wearable display device 100 as described in FIG. 1. The processor 202 may, in some embodiment, buffer the one or more frames 212 in a frame buffer 214, which may temporarily store the one or more frames 212 before sending the one or more frames 212 for display. Each frame 212 may be associated with a corresponding load (e.g., a number of display pixels, and the like associated with each frame 212). In some embodiments, the frame buffer 214 may be associated with a load 216, which may correspond to pixel values (i.e., pixel colors) of the individual frames 212 buffered (i.e., temporarily stored) at the frame buffer 214. The processor 202 may determine a target voltage level 218 for the laser diode 208 operably coupled to the current source 210 (e.g., a laser diode driver associated with a device, such as wearable display device for augmented reality applications) based at least in part on the load 216.

The processor 202 may determine the target voltage level 218 for the laser diode 208 by referencing a voltage table 220, which may include a set of target voltage levels 218 in which each target voltage level may map to a respective load condition, or a respective range of load conditions. The processor 202 may determine a first target voltage level 218-1 based on a first load condition (e.g., a number of particular pixels, such as red pixels) associated with a first frame 212. In some embodiments, the processor 202 may determine a second target voltage level 218-2 based on a second load condition (e.g., a number of particular pixels, such as red pixels) associated with a second frame 212.

For example, the processor 202 may determine the first target voltage level 218-1 based on a first load condition (e.g., a number of particular pixels, such as blue pixels and/or green pixels) associated with a first frame 212 and mapping the first load condition to a respective load condition, or a respective range of load conditions in the voltage table 220. Based on the mapping, the processor 202 may identify the first target voltage level 218-1. In some embodiments, the processor 202 may determine a second target voltage level 218-2 based on a second load condition (e.g., a number of particular pixels, such as blue pixels and/or green pixels) associated with a second frame 212 and mapping the second load condition to a respective load condition, or a respective range of load conditions in the voltage table 220. Based on the mapping, the processor 202 may identify the second target voltage level 218-2. The second target voltage level 218-2 may be different than the first target voltage level 218-2. Additionally, the first frame 212 may be different than the second frame 212. In some embodiments, the first frame 212 and the second frame 212 may be contiguous in a time domain. Alternatively, the first frame 212 and the second frame 212 may be noncontiguous in a time domain.

The processor 202 may output a control signal to the voltage converter 204 to change a voltage level based on the load condition (e.g., a high load condition). A high load condition may correspond to a load that satisfies a threshold (e.g., a threshold number of pixels). In some other embodiments, the processor 202 may output a control signal to the voltage converter 204 to modify a voltage level to the target voltage level based on the load condition. For example, the voltage converter 204 may generate (or provide) the target voltage level for the laser diode 208 based on a base voltage level 222, which the processor 202 may signal to the voltage converter 204. An output terminal of the voltage converter 204 may be coupled to an input terminal of the laser diode 208 to provide the respective voltage level (or current level0. The processor 202 may thereby be configured to set the base voltage level based on a load condition (e.g., a low load condition or a high load condition).

Figure 3:
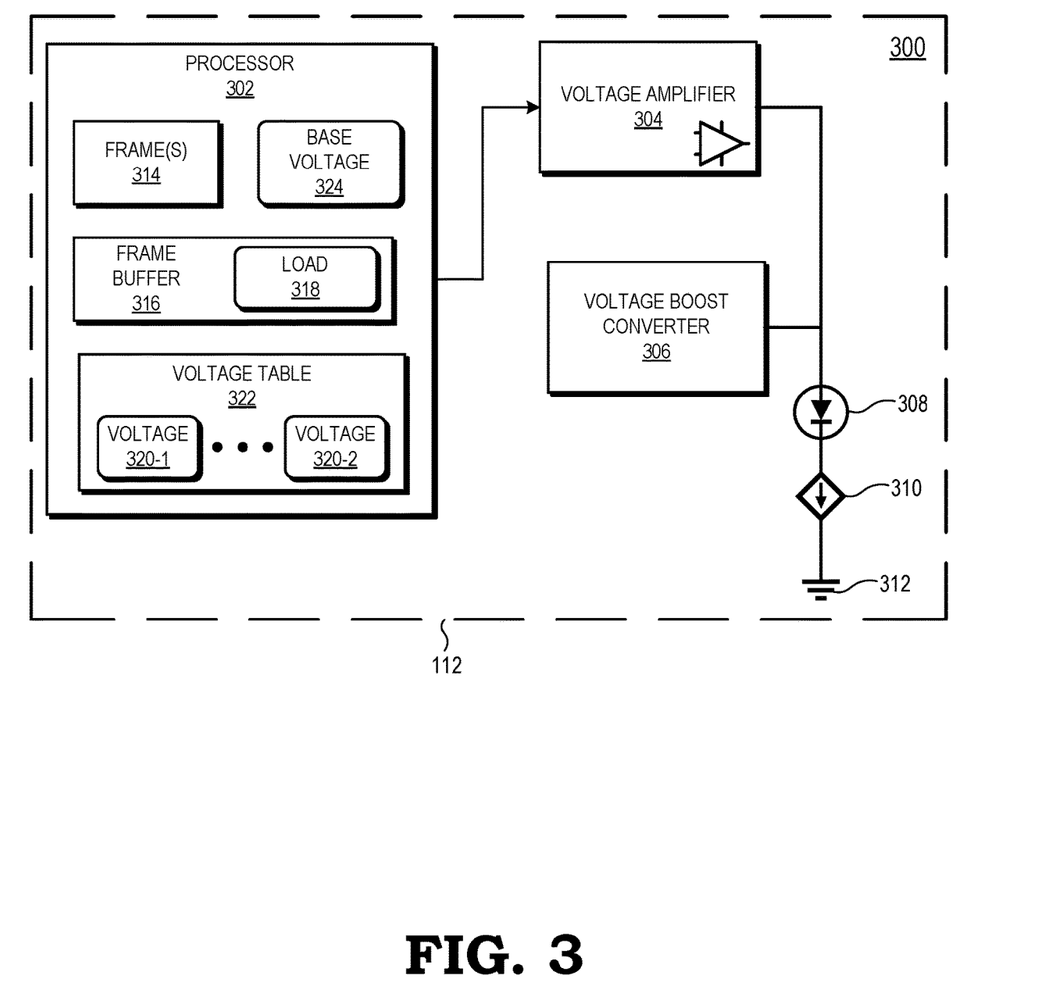

FIG. 3 shows a block diagram of a laser channel configuration 300 that supports techniques for dynamic voltage control for laser diodes in accordance with embodiments of the present disclosure. The laser channel configuration 300 may implement or be implemented by aspects of the wearable display device 100 or the device 400 as described with reference to FIGS. 1 and 4, respectively. The laser channel configuration 300 may include a processor 302, a voltage amplifier 304, a voltage boost converter 306, a laser diode 308, a current source 310, and a ground 312. Some or all of these components are fully or partially contained within an inner volume of the support structure 102, such as within the arm 104 in region 112 of the support structure 102 of the wearable display device 100 as described with reference to FIG. 1. One or more of these components may be coupled (e.g., operatively, communicatively, functionally, electronically) to each other. One or more of these components may include an input terminal and an output terminal.

The processor 302 may be an example of a processor as described herein. The processor 302 may include an output terminal that is coupled to an input of the voltage amplifier 304. For example, the processor 302 and the voltage amplifier 304 may be in electronic communication via an interface, such as a data bus or a DAC control. The processor 302 may determine a target voltage level for the laser diode 308 operably coupled to the current source 310 (e.g., a laser diode driver associated with a device, such as augmented reality glasses) based at least in part on a load condition. The laser diode 308 may be a green laser diode or a blue laser diode, or both.

In some embodiments, the processor 302 may output a control signal to the voltage amplifier 304 to adjust a voltage level based on the load condition (e.g., a high load condition). In some other embodiments, the processor 302 may output a control signal to the voltage amplifier 304 to adjust a voltage level to the target voltage level based on the load condition. For example, the voltage amplifier 304 may generate (or provide) the target voltage level for the laser diode 308 based on a base voltage level. An output terminal of the voltage amplifier 304 may be coupled to an output terminal of the voltage boost converter 306 or an input terminal of the laser diode 308, or both. The voltage boost converter 306 may be configured to set the base voltage level based on a load condition (e.g., a low load condition).

The voltage boost converter 306 may be configured to select the base voltage level for the laser diode 308 based on a power configuration associated with the laser diode 308. The power configuration may indicate a base voltage level for a base load condition (e.g., a low load condition) of the laser diode 308. There may be different power configuration for different types of laser diodes. In some embodiments, the voltage boost converter 306 may be configured to select a first base voltage level for the laser diode 308 based on a first power configuration that corresponds to a blue laser diode (e.g., when the laser diode 308 is a blue laser diode). In some other embodiments, the voltage boost converter 306 may be configured to select a second base voltage level different than the first base voltage level for the laser diode 308 based on a first power configuration that corresponds to a green laser diode (e.g., when the laser diode 308 is a green laser diode).

In some embodiments, the voltage boost converter 306 may be configured to determine a set of base voltage levels based on the power configuration. Each base voltage level of the set of base voltages levels may correspond to a respective load condition. For example, the first base voltage level for the laser diode 308 may be based on a first load condition, while the second base voltage level for the laser diode 308 may be based on a second load condition greater than or less than the first base voltage level. In some embodiments, both the first load condition and the second load condition may be classified as a high load condition. As such, both the first load condition and the second load condition may be greater than a low load condition.

The processor 302 and the voltage boost converter 306 may be configured to determine laser diode forward voltage drop associated with the laser diode 308, and thereby select the base voltage level based on the laser diode forward voltage drop associated with the laser diode 308. In some other embodiments, the voltage boost converter 306 may be configured to determine power headroom associated with the laser diode 308, and thus select the base voltage level based on the power headroom associated with the laser diode 308.

The processor 302, the voltage amplifier 304, and the voltage boost converter 306 may provide the target voltage level to the laser diode 308 for high load conditions. For example, an op-amp of the voltage amplifier 304 may provide a voltage swing above the base voltage level provided by the voltage boost converter 306. The laser channel configuration 300 may provide improvements to operations of devices, such as wearable display devices by reducing a latency for dynamically adjusting a voltage level for varying load conditions. As a result, the laser channel configuration 300 may provide faster timing control (e.g., 10 µs) for voltage control of the laser diode 308.

By way of example, the processor 302 may receive one or more frames 314 to be displayed, such as at the wearable display device 100 as described in FIG. 1. The processor 302 may, in some embodiment, buffer the one or more frames 314 in a frame buffer 316, which may temporarily store the one or more frames 314 before sending the one or more frames 314 for display. Each frame 314 may be associated with a corresponding load (e.g., a number of display pixels, and the like, associated with each frame 314). In some embodiments, the frame buffer 316 may be associated with a load 318, which may correspond to a number of pixels associated with one or more frames 314 buffered (i.e., temporarily stored) at the frame buffer 316.

The processor 302 may determine a target voltage level 320 for the laser diode 308 operably coupled to the current source 310 (e.g., a laser diode driver associated with a device, such as wearable display device for augmented reality applications) based at least in part on a load condition of the one or more frames 314. The processor 302 may determine the target voltage level 320 for the laser diode 308 by referencing a voltage table 322, which may include a set of target voltage levels 320 in which each target voltage level may map to a respective load condition, or a respective range of load conditions. For example, the processor 302 may determine a first target voltage level 320-1 based on a first load condition (e.g., a number of particular pixels, such as blue pixels and/or green pixels) associated with a first frame 314, and mapping the first load condition to a respective load condition, or a respective range of load conditions in the voltage table 322. Based on the mapping, the processor 302 may identify the first target voltage level 320-1.

In some embodiments, the processor 302 may determine a second target voltage level 320-2 based on a second load condition (e.g., a number of particular pixels, such as blue pixels and/or green pixels) associated with a second frame 314, and mapping the second load condition to a respective load condition, or a respective range of load conditions in the voltage table 322. Based on the mapping, the processor 302 may identify the second target voltage level 320-2. The second target voltage level 320-2 may be different than (e.g., greater than or less than) the first target voltage level 320-2. Additionally, the first frame 314 may be different than the second frame 314. In some embodiments, the first frame 314 and the second frame 314 may be consecutive in a set of frames 314. Alternatively, the first frame 314 and the second frame 314 may be nonconsecutive in a set of frames 314.

The processor 302, the voltage amplifier 304, and the voltage boost converter 306 may provide the target voltage level 320 to the laser diode 308 for high load conditions. A high load condition may correspond to a load that satisfies a threshold (e.g., a threshold number of pixels). For example, an op-amp of the voltage amplifier 304 may provide a voltage swing above the base voltage level provided by the voltage boost converter 306. The laser channel configuration 300 may provide improvements to operations of devices, such as wearable display devices by reducing a latency for dynamically adjusting a voltage level for varying load conditions. As a result, the laser channel configuration 300 may provide faster timing control (e.g., 10 µs) for voltage control of the laser diode 308.

Figure 4:
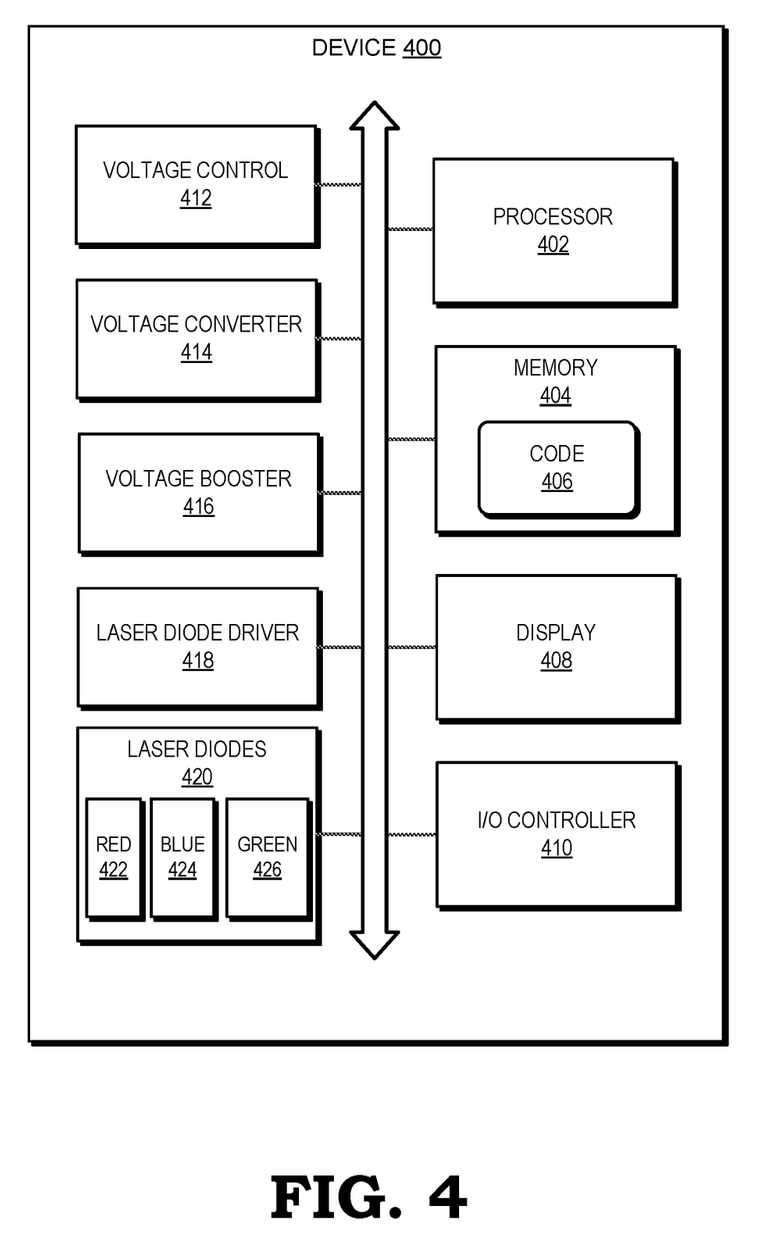
FIG. 4 is a block diagram of a system including a device that supports techniques for dynamic voltage control for laser diodes in accordance with embodiments of the present disclosure.

FIG. 4 is a block diagram of a system including a device 400 that supports techniques for dynamic voltage control for laser diodes in accordance with embodiments of the present disclosure. The device 400 may be an example of or include components of the wearable display device 100. For example, the device 400 may be a wearable display device, such as a head-mounted display (HMD) device, or the like. The device 400 may include components for information exchange including components for transmitting and receiving content, such as images and videos. The device 400 may also include components for dynamic voltage control, such as a processor 402, a memory 404, a display 408, an I/O controller 410, a voltage control 412, a voltage converter 414, a voltage booster 416, a laser diode driver 418, and one or more laser diodes 420. These components may be in electronic communication or otherwise coupled (e.g., operatively, communicatively, functionally, electronically, electrically) via one or more interfaces.

The processor 402 may be a general-purpose processor, a digital signal processor (DSP), a central processor unit (CPU), a graphic processor unit (GPU), an image signal processor (ISP), an application-specific integrated circuit (ASIC), a field programmable gate array (FPGA), or any combination thereof. In some embodiments, the processor 402 may be configured to operate a memory array (e.g., an ISP frame buffer) using a memory controller. The processor 402 may be configured to execute computer-readable instructions stored in the memory 404 to cause the device 400 to perform various functions (e.g., functions or tasks supporting dynamic voltage control for laser diodes). For example, the device 400 or a component of the device 40 may include the processor 402 and the memory 404 coupled to the processor 402, the processor 402 and the memory 404 configured to perform various functions described herein.

The memory 404 may include RAM and ROM. The memory 404 may store computer-readable, computer-executable code 406 including instructions that, when executed by the processor 402, cause the device 400 to perform various functions described herein. The code 404 may be stored in a non-transitory computer-readable medium such as system memory or other type of memory. In some embodiments, the memory 404 may contain, among other things, a BIOS which may control basic hardware or software operation, such as the interaction with peripheral components or devices.

The display 408 may represent a unit capable of display content, such as video, images, text or any other type of content for consumption by a user (e.g., a viewer). For example, the device 400 may be configured to display content for various applications, such as augmented reality applications. The display 408 may include a liquid-crystal display (LCD), a light emitting diode (LED) display, an organic LED (OLED) display, an active-matrix OLED (AMOLED), or the like.

The I/O controller 410 may manage input and output signals for the device 400. The I/O controller 410 may also manage peripherals not integrated into the device 400. In some embodiments, the I/O controller 410 may represent a physical connection or port to an external peripheral. The I/O controller 410 may utilize an operating system such as ANDROID® or another known operating systems. In some other embodiments, the I/O controller 410 may represent or interact with the display 408. In some embodiments, a user may interact with the device 400 via the I/O controller 410 or via hardware components controlled by the I/O controller 410.

The voltage control 412 may be made up of one or more circuit elements, such as resistors, capacitors, diodes, and the like. The voltage control 412 may be configured to support techniques for dynamic voltage control for the laser diodes 420. The voltage converter 414 may be made up of one or more circuit elements, such as resistors, capacitors, diodes, and the like. The voltage converter 414 may be an electric power converter which changes the voltage of an electrical power source. In some embodiments, the voltage converter 414 may be combined with other components to create a power supply. The voltage booster 416 may be made up of one or more circuit elements, such as amplifiers (e.g., op-amps), resistors, capacitors, diodes, and the like. The voltage booster 416 may be configured to provide a voltage swing above a base voltage level as described herein.

The laser diodes driver 418 may be made up of one or more circuit elements, such as resistors, capacitors, diodes, and the like. The laser diodes driver 418 may be a current source (e.g., a current sink) for the laser diodes 420. The laser diodes driver 418 may be a constant current (CW) driver, a pulsing driver (including QCW), a low-power driver, or a high-power driver. The laser diodes 420 a semiconductor device similar to a light-emitting diode in which a diode pumped directly with electrical current can create lasing conditions at the diode's junction. The laser diodes 420 may include one or more laser diodes having one or more wavelengths. For examples, the laser diodes 420 may include a red laser diode 422, a blue laser diode 424, and a green laser diode 426.

The components of the device 400, such as the processor 402, the memory 404, the display 408, the I/O controller 410, the voltage control 412, the voltage converter 414, the voltage booster 416, the laser diode driver 418, and one or more laser diodes 420 may set a voltage level (also referred to as a boost voltage) to a target voltage level as a base voltage to accommodate a laser diode forward voltage drop ($V_f$) and a overhead (e.g., a power headroom) of the laser diode driver 418 for various load conditions (e.g., a light load condition). As described herein, the term light load condition may be a load condition that is equal to or less than a threshold. In some embodiments, when a higher load condition occurs, the device 400 may use one or more of the voltage control 412, the voltage converter 414, and the voltage booster 416, to generate extra voltage on top of the base voltage to meet the target voltage level. As described herein, the term high load condition may be a load condition that is equal to or greater than a threshold.

Figure 5:
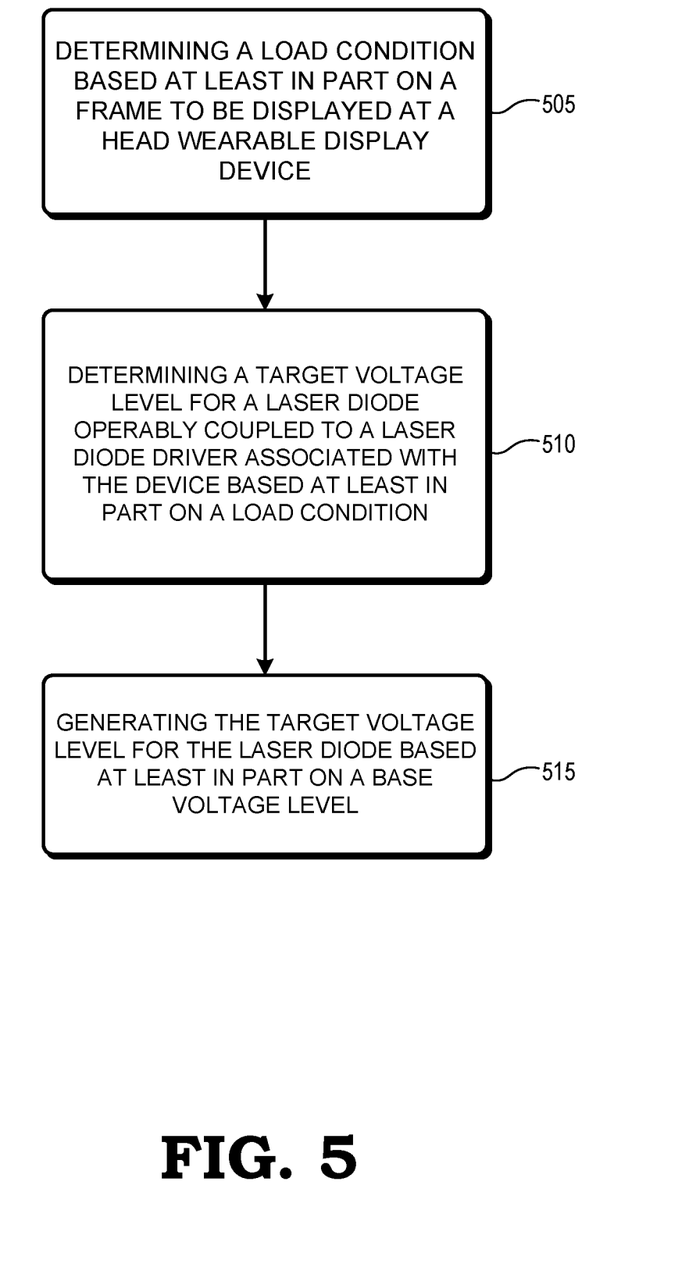
FIG. 5 through 7 show flowcharts illustrating methods that support techniques for dynamic voltage control for laser diodes in accordance with embodiments of the present disclosure.

FIG. 5 shows a flowchart illustrating a method 500 that support techniques for dynamic voltage control for laser diodes in accordance with embodiments of the present disclosure. The operations of the method 500 may be implemented by a device (e.g., a wearable display device) or its components as described herein. For example, the operations of the method 500 may be performed by a wearable display device 100 as described with reference to FIG. 1. In some embodiments, a device may execute a set of instructions (e.g., code) to control the functional elements of the device to perform the described functions (e.g., dynamic voltage control for laser diodes). Additionally or alternatively, the device may perform aspects of the described functions using special-purpose hardware.

At 505, the method 500 may include determining a load condition based at least in part on a frame to be displayed at a head wearable display device. The operations of 505 may be performed in accordance with embodiments as disclosed herein. In some embodiments, aspects of the operations of 505 may be performed by a processor 402 as described with reference to FIG. 4.

At 510, the method 500 may include determining a target voltage level for a laser diode operably coupled to a laser diode driver associated with the device based at least in part on a load condition. The operations of 510 may be performed in accordance with embodiments as disclosed herein. In some embodiments, aspects of the operations of 510 may be performed by a voltage control 412 as described with reference to FIG. 4. For example, the method 500 include determining a target voltage level for a laser diode 420 operably coupled to a laser diode driver 418 associated with a device 400 as described with reference to FIG. 4.

At 515, the method 500 may include generating the target voltage level for the laser diode based at least in part on a base voltage level. The operations of 515 may be performed in accordance with embodiments as disclosed herein. In some embodiments, aspects of the operations of 515 may be performed by a voltage booster 416 as described with reference to FIG. 4. For example, the method 500 include generating, by the voltage booster 416, a target voltage level for a laser diode 420 based at least in part on a base voltage level as described with reference to FIG. 4.

Figure 6:
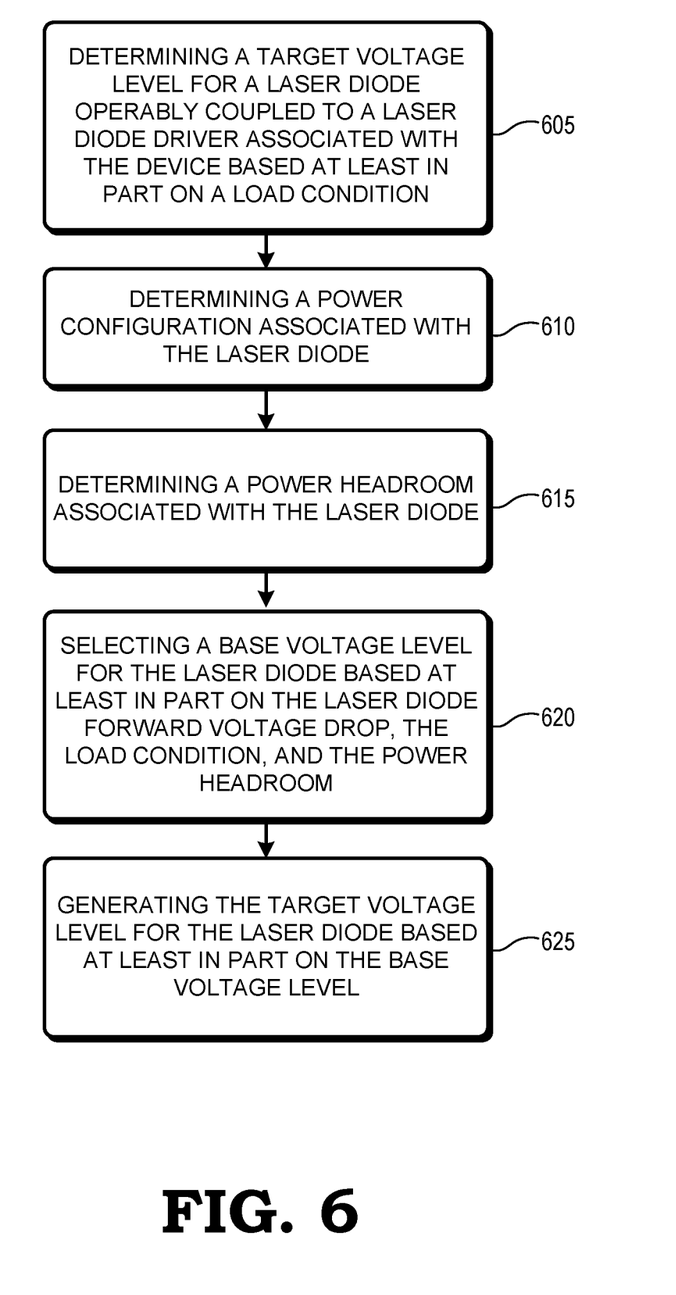

FIG. 6 shows a flowchart illustrating a method 600 that support techniques for dynamic voltage control for laser diodes in accordance with embodiments of the present disclosure. The operations of the method 600 may be implemented by a device (e.g., a wearable display device) or its components as described herein. For example, the operations of the method 600 may be performed by a wearable display device 100 as described with reference to FIG. 1. In some embodiments, a device may execute a set of instructions (e.g., code) to control the functional elements of the device to perform the described functions (e.g., dynamic voltage control for laser diodes). Additionally or alternatively, the device may perform aspects of the described functions using special-purpose hardware.

At 605, the method 600 may include determining a target voltage level for a laser diode operably coupled to a laser diode driver associated with the device based at least in part on a load condition. The operations of 605 may be performed in accordance with embodiments as disclosed herein. In some embodiments, aspects of the operations of 605 may be performed by a voltage control 412 as described with reference to FIG. 4. For example, the method 600 include determining, by the voltage control 412, a target voltage level for one or more laser diodes of the laser diodes 420 operably coupled to the laser diode driver 418 associated with the device 400 as described with reference to FIG. 4.

At 610, the method 600 may include determining a power configuration associated with the laser diode. The operations of 610 may be performed in accordance with embodiments as disclosed herein. In some embodiments, aspects of the operations of 610 may be performed by a voltage control 412 as described with reference to FIG. 4. For example, the method 600 include determining, by the voltage control 412, a power configuration associated with one or more laser diodes of the laser diodes 420 as described with reference to FIG. 4.

At 615, the method 600 may include determining a power headroom associated with the laser diode. The operations of 615 may be performed in accordance with embodiments as disclosed herein. In some embodiments, aspects of the operations of 615 may be performed by a voltage control 412 as described with reference to FIG. 4. For example, the method 600 include determining, by the voltage control 412, a power headroom associated with one or more laser diodes of the laser diodes 420 as described with reference to FIG. 4.

At 620, the method 600 may include selecting a base voltage level for the laser diode based at least in part on the laser diode forward voltage drop, the load condition, and the power headroom. In some embodiments, the device may determine a set of base voltage levels based at least in part on the power configuration. Each base voltage level of the set of base voltages levels corresponds to a respective load condition. The operations of 620 may be performed in accordance with embodiments as disclosed herein. In some embodiments, aspects of the operations of 620 may be performed by a voltage control 412 as described with reference to FIG. 4. For example, the method 600 include selecting, by the voltage control 412, a base voltage level for one or more laser diodes of the laser diodes 420 based at least in part on a laser diode forward voltage drop, a load condition, and a power headroom as described with reference to FIG. 4.

At 625, the method 600 may include generating the target voltage level for the laser diode based at least in part on the base voltage level. The operations of 625 may be performed in accordance with embodiments as disclosed herein. In some embodiments, aspects of the operations of 625 may be performed by a voltage booster 416 as described with reference to FIG. 4. For example, the method 600 include generating, by the voltage booster 416, a target voltage level for one or more laser diodes of the laser diodes 420 based at least in part on a base voltage level as described with reference to FIG. 4.

Figure 7:
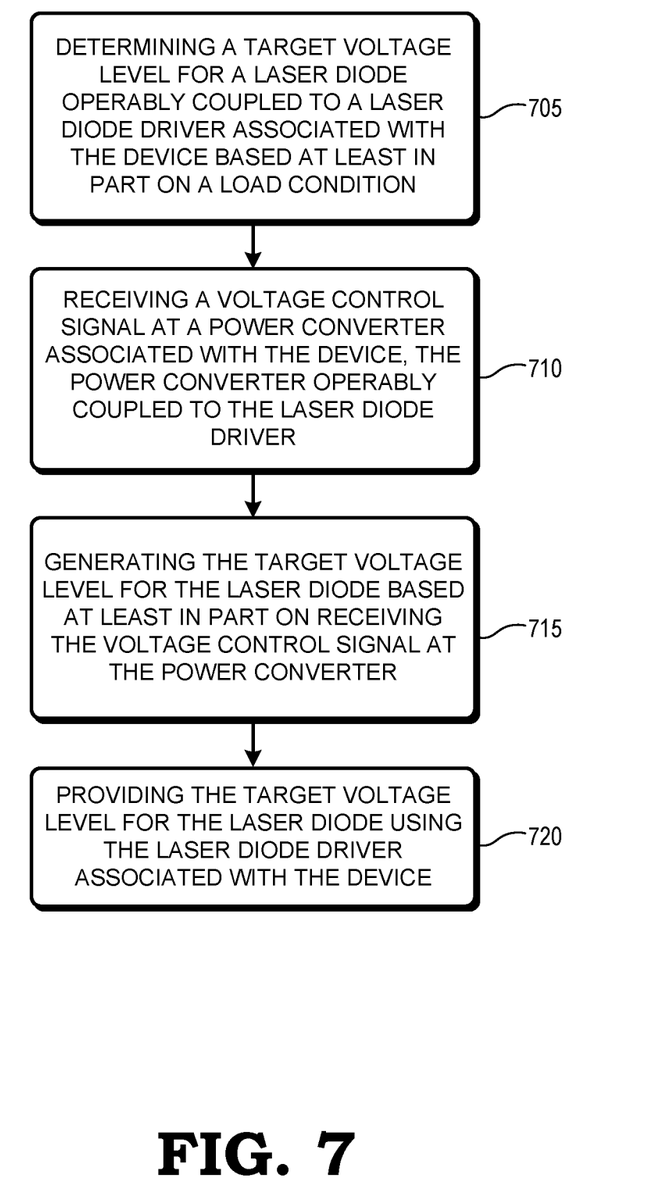

FIG. 7 shows a flowchart illustrating a method 700 that support techniques for dynamic voltage control for laser diodes in accordance with embodiments of the present disclosure. The operations of the method 700 may be implemented by a device (e.g., a wearable display device) or its components as described herein. For example, the operations of the method 700 may be performed by a wearable display device 100 as described with reference to FIG. 1. In some embodiments, a device may execute a set of instructions (e.g., code) to control the functional elements of the device to perform the described functions (e.g., dynamic voltage control for laser diodes). Additionally or alternatively, the device may perform aspects of the described functions using special-purpose hardware.

At 705, the method 700 may include determining a target voltage level for a laser diode operably coupled to a laser diode driver associated with the device based at least in part on a load condition. The operations of 705 may be performed in accordance with embodiments as disclosed herein. In some embodiments, aspects of the operations of 705 may be performed by a voltage control 412 as described with reference to FIG. 4. For example, the method 700 include determining, by the voltage control 412, a target voltage level for one or more laser diodes of the laser diodes 420 operably coupled to the laser diode driver 418 associated with the device 400 as described with reference to FIG. 4.

At 710, the method 700 may include receiving a voltage control signal at a power converter associated with the device, the power converter operably coupled to the laser diode driver. The operations of 710 may be performed in accordance with embodiments as disclosed herein. In some embodiments, aspects of the operations of 710 may be performed by a voltage control 412 as described with reference to FIG. 4. For example, the method 700 include receiving a voltage control signal at the voltage converter 414 (also referred to as a power converter) associated with the device 400, the voltage converter 414 operably coupled to the laser diode driver 418 as described with reference to FIG. 4.

At 715, the method 700 may include generating the target voltage level for the laser diode based at least in part on receiving the voltage control signal at the power converter. The operations of 715 may be performed in accordance with embodiments as disclosed herein. In some embodiments, aspects of the operations of 715 may be performed by a voltage booster 416 as described with reference to FIG. 4. For example, the method 700 include generating, by the voltage booster 416, a target voltage level for one or more laser diodes of the laser diodes 420 based at least in part on receiving a voltage control signal at the voltage converter 414 (also referred to as a power converter) as described with reference to FIG. 4.

At 720, the method 700 may include providing the target voltage level for the laser diode using the laser diode driver associated with the device. The operations of 720 may be performed in accordance with embodiments as disclosed herein. In some embodiments, aspects of the operations of 720 may be performed by a voltage booster 416 as described with reference to FIG. 4. For example, the method 700 include providing, by the voltage booster 416, a target voltage level for the laser diode 420 using the laser diode driver 418 associated with the device 400 as described with reference to FIG. 4.

The described techniques relate to improved methods, systems, devices, and apparatuses that support techniques for dynamic voltage control for laser diodes in head-wearable display devices. A laser diode driver may be configured to drive a current to a respective laser diode safely and at an appropriate power level. In some embodiments, a fixed voltage may be applied to the respective laser diode to provide the appropriate power level. An amplitude of the fixed voltage may be dependent on various factors, for example, including a laser diode forward voltage drop ($V_f$) and a power headroom. Some head-wearable display devices may experience wasted resources (e.g., power consumption, lower battery life) due to laser diode drivers of head-wearable display devices operating at an excessive laser diode forward voltage drop ($V_f$) and power headroom. Therefore, it may be desirable to provide improvements to laser diode drivers for head-wearable display devices by implementing dynamic voltage control for laser diodes as described herein.

A method for voltage control at a device is described. The method may include determining a load condition based at least in part on a frame to be displayed at the head wearable display device, determining a target voltage level for a laser diode operably coupled to a laser diode driver associated with the device based at least in part on the load condition, and providing the target voltage level for the laser diode based at least in part on a base voltage level.

In some embodiments, the method may further include selecting the base voltage level for the laser diode based at least in part on a power configuration associated with the laser diode. In some embodiments, the method may further include determining a set of base voltage levels based at least in part on the power configuration, each base voltage level of the set of base voltages levels corresponds to a respective load condition. In some other embodiments, selecting the base voltage level for the laser diode is based at least in part on the load condition. In some embodiments, the method may further include determining a laser diode forward voltage drop associated with the laser diode. In some other embodiments, selecting the base voltage level for the laser diode is based at least in part on the laser diode forward voltage drop and the load condition. In some embodiments, the method may further include determining a power headroom associated with the laser diode. In some other embodiments, selecting the base voltage level for the laser diode is based at least in part on the laser diode forward voltage drop, the load condition, and the power headroom.

In some embodiments, the method may further include receiving a voltage control signal at a power converter associated with the device, the power converter operably coupled to the laser diode driver. In some other embodiments, generating the target voltage level for the laser diode associated with the device is based at least in part on receiving the voltage control signal at the power converter. In some embodiments, the method may further include providing the target voltage level for the laser diode using the laser diode driver associated with the device. In some embodiments, the power converter comprises a buck converter.

In some embodiments, the method may further include generating the target voltage level for the laser diode associated with the device using an amplifier operably coupled to the laser diode driver. In some embodiments, the method may further include a voltage booster operably coupled to the laser diode driver to provide the target voltage level based at least in part on the load condition. In some embodiments, the laser diode comprises one or more of: a red laser diode, a blue laser diode, and a green laser diode.

An apparatus for voltage control at a device is described. The apparatus may include a processor; memory operably coupled with the processor; a laser diode operably coupled to the processor and the memory; a laser diode driver operably coupled to the processor, the memory, and the laser diode; and instructions stored in the memory and executed by the processor to cause the apparatus to: determine a target voltage level for a laser diode operably coupled to a laser diode driver associated with the device based at least in part on a load condition, and generate the target voltage level for the laser diode based at least in part on a base voltage level.

Another apparatus for voltage control at a device is described. The apparatus may include means for determining a target voltage level for a laser diode operably coupled to a laser diode driver associated with the device based at least in part on a load condition, and means for generating the target voltage level for the laser diode based at least in part on a base voltage level.

The following provides an overview of some embodiments of the present disclosure:

Embodiment 1: A method for voltage control at a device: determining a load condition based at least in part on a frame to be displayed at the head wearable display device; determining a target voltage level for a laser diode operably coupled to a laser diode driver associated with the device based at least in part on a load condition; and generating the target voltage level for the laser diode based at least in part on a base voltage level.

Embodiment 2: The method of embodiment 1, further comprising: selecting the base voltage level for the laser diode based at least in part on a power configuration associated with the laser diode.

Embodiment 3: The method of embodiment 2, further comprising: determining a set of base voltage levels based at least in part on the power configuration, wherein each base voltage level of the set of base voltages levels corresponds to a respective load condition, wherein selecting the base voltage level for the laser diode is based at least in part on the load condition.

Embodiment 4: The method of embodiment 3, further comprising: determining a laser diode forward voltage drop associated with the laser diode, wherein selecting the base voltage level for the laser diode is based at least in part on the laser diode forward voltage drop and the load condition.

Embodiment 5: The method of embodiment 4, further comprising: determining a power headroom associated with the laser diode, wherein selecting the base voltage level for the laser diode is based at least in part on the laser diode forward voltage drop, the load condition, and the power headroom.

Embodiment 6: The method of embodiments 1 through 5, further comprising: receiving a voltage control signal at a power converter associated with the device, the power converter operably coupled to the laser diode driver, wherein generating the target voltage level for the laser diode associated with the device is based at least in part on receiving the voltage control signal at the power converter; and providing the target voltage level for the laser diode using the laser diode driver associated with the device.

Embodiment 7: The method of embodiment 6, wherein the power converter comprises a buck converter.

Embodiment 8: The method of embodiments 1 through 7, further comprising: generating the target voltage level for the laser diode associated with the device using an amplifier operably coupled to the laser diode driver.

Embodiment 9: The method of embodiments 1 through 8, further comprising: providing the target voltage level based at least in part on the load condition and using a voltage booster operably coupled to the laser diode driver.

Embodiment 10: The method of embodiments 1 through 9, wherein the laser diode comprises one or more of: a red laser diode, a blue laser diode, and a green laser diode.

Embodiment 11: An apparatus for voltage control at a device, comprising: a processor; memory operably coupled with the processor; a laser diode operably coupled to the processor and the memory; a laser diode driver operably coupled to the processor, the memory, and the laser diode; and instructions stored in the memory and executed by the processor to cause the apparatus to perform a method of any of embodiments 1 through 10.

Embodiment 12: An apparatus for voltage control at a device, comprising at least one means for performing a method of any of embodiments 1 through 10.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method for voltage control at a head wearable display device, comprising:
    determining a load condition based at least in part on a frame to be displayed at the head wearable display device;
    determining a target voltage level for a laser diode operably coupled to a laser diode driver associated with the head wearable display device based at least in part on the load condition; and
    providing the target voltage level for the laser diode based at least in part on a base voltage level.

2. The method of claim 1, further comprising:
    selecting the base voltage level for the laser diode based at least in part on a power configuration associated with the laser diode.

3. The method of claim 2, further comprising:
    determining a set of base voltage levels based at least in part on the power configuration, wherein each base voltage level of the set of base voltages levels corresponds to a respective load condition,
    wherein selecting the base voltage level for the laser diode is based at least in part on the load condition.

4. The method of claim 3, further comprising:
    determining a laser diode forward voltage drop associated with the laser diode,
    wherein selecting the base voltage level for the laser diode is based at least in part on the laser diode forward voltage drop and the load condition.

5. The method of claim 4, further comprising:
    determining a power headroom associated with the laser diode,
    wherein selecting the base voltage level for the laser diode is based at least in part on the laser diode forward voltage drop, the load condition, and the power headroom.

6. The method of claim 1, further comprising:
    receiving a voltage control signal at a power converter associated with the head wearable display device, the power converter operably coupled to the laser diode driver, wherein generating the target voltage level for the laser diode associated with the head wearable display device is based at least in part on receiving the voltage control signal at the power converter; and
    providing the target voltage level for the laser diode using the laser diode driver associated with the head wearable display device.

7. The method of claim 6, wherein the power converter comprises a buck converter.

8. The method of claim 1, further comprising:
    generating the target voltage level for the laser diode associated with the head wearable display device using an amplifier operably coupled to the laser diode driver.

9. The method of claim 1, further comprising:
    providing the target voltage level based at least in part on the load condition and using a voltage booster operably coupled to the laser diode driver.

10. The method of claim 1, wherein the laser diode comprises one or more of: a red laser diode, a blue laser diode, and a green laser diode.

11. An apparatus for voltage control at a head wearable display device, comprising:
    a processor;
    memory operably coupled with the processor;
    a laser diode operably coupled to the processor and the memory;
    a laser diode driver operably coupled to the processor, the memory, and the laser diode; and
    instructions stored in the memory and executed by the processor to cause the apparatus to:
        determine a load condition based at least in part on a frame to be displayed at the head wearable display device;
        determine a target voltage level for a laser diode operably coupled to a laser diode driver associated with the head wearable display device based at least in part on the load condition; and provide the target voltage level for the laser diode based at least in part on a base voltage level.

12. The apparatus of claim 11, wherein the instructions are further executable by the processor to cause the apparatus to:
select the base voltage level for the laser diode based at least in part on a power configuration.

13. The apparatus of claim 12, wherein the instructions are further executable by the processor to cause the apparatus to:
determine a set of base voltage levels based at least in part on the power configuration, wherein each base voltage level of the set of base voltages levels corresponds to a respective load condition,
wherein the instructions to select the base voltage level for the laser diode are further executable by the processor based at least in part on the load condition.

14. The apparatus of claim 13, wherein the instructions are further executable by the processor to cause the apparatus to:
determine a laser diode forward voltage drop associated with the laser diode,
wherein the instructions to select the base voltage level for the laser diode are further executable by the processor based at least in part on the laser diode forward voltage drop and the load condition.

15. The apparatus of claim 14, wherein the instructions are further executable by the processor to cause the apparatus to:
determine a power headroom associated with the laser diode,
wherein the instructions to select the base voltage level for the laser diode are further executable by the processor based at least in part on the laser diode forward voltage drop, the load condition, and the power headroom.

16. The apparatus of claim 11, wherein the instructions are further executable by the processor to cause the apparatus to:
receive a voltage control signal at a power converter associated with the head wearable display device, the power converter operably coupled to the laser diode driver, wherein the instructions to generate the target voltage level for the laser diode associated with the head wearable display device are further executable by the processor based at least in part on receiving the voltage control signal at the power converter; and
provide the target voltage level for the laser diode using the laser diode driver associated with the head wearable display device.

17. The apparatus of claim 16, wherein the power converter comprises a buck converter.

18. The apparatus of claim 11, wherein the instructions are further executable by the processor to cause the apparatus to:
generate the target voltage level for the laser diode associated with the head wearable display device using an amplifier operably coupled to the laser diode driver.

19. The apparatus of claim 11, further comprising:
a voltage booster operably coupled to the laser diode driver to provide the target voltage level based at least in part on the load condition.

20. An apparatus for voltage control at a head wearable display device, comprising:
an integrated circuit configured to:
determine a load condition based at least in part on a frame to be displayed at the head wearable display device; and
determine a target voltage level for a laser diode operably coupled to a laser diode driver associated with the head wearable display device based at least in part on the load condition; and
a voltage control configured to generate the target voltage level for the laser diode based at least in part on a base voltage level.

* * * * *